United States Patent [19]
Gonzalez et al.

[11] Patent Number: 5,453,396
[45] Date of Patent: Sep. 26, 1995

[54] SUB-MICRON DIFFUSION AREA ISOLATION WITH SI-SEG FOR A DRAM ARRAY

[75] Inventors: Fernando Gonzalez; Angus C. Fox, III, both of Boise, Id.

[73] Assignee: Micron Technology, Inc.

[21] Appl. No.: 250,897

[22] Filed: May 31, 1994

[51] Int. Cl.$^6$ .......................... H01L 21/76; H01L 21/336
[52] U.S. Cl. .................................. 437/69; 437/52; 437/89
[58] Field of Search .................... 437/69, 89, 41, 437/52; 148/DIG. 85, DIG. 86, DIG. 117

[56] References Cited

U.S. PATENT DOCUMENTS

| | | | |
|---|---|---|---|
| 5,100,830 | 3/1992 | Morita | 437/89 |
| 5,135,884 | 8/1992 | Miller | 437/89 |

FOREIGN PATENT DOCUMENTS

| | | |
|---|---|---|
| 60-193324 | 10/1985 | Japan . |
| 61-203632 | 9/1986 | Japan . |
| 1119038 | 5/1989 | Japan . |

*Primary Examiner*—George Fourson
*Attorney, Agent, or Firm*—David J. Paul

[57] ABSTRACT

The present invention is a process for forming diffusion areas and field isolation regions on a silicon substrate, by the steps of: growing a field oxide layer on the surface of the substrate; forming a mask pattern which exposes a plurality of spaced-apart regions on the surface of the field oxide layer; removing portions of the field oxide layer in the exposed, spaced-apart regions with an anisotropic etch so as to leave a cavity in each spaced-apart region, each cavity having as its floor an exposed region of the silicon substrate, and having vertical walls of field oxide; angularly chamfering the rim of each cavity with a facet etch; and filling each cavity with silicon using selective epitaxial growth, and using the floor of each cavity as the seed crystal for such growth.

23 Claims, 4 Drawing Sheets

5,453,396

SUB-MICRON DIFFUSION AREA ISOLATION WITH SI-SEG FOR A DRAM ARRAY

FIELD OF THE INVENTION

This invention relates to semiconductor fabrication process and more particularly to a process to form sub-micron diffusion area isolation.

BACKGROUND OF THE INVENTION

During semiconductor fabrication, and in particular when fabricating densely packed integrated circuits, limitations of photolithographic equipment dictate the minimum pitch (or feature width) available for any given process. For example, if a certain piece of equipment provides a 0.6 micron pitch, then the space between a patterned line and the cross-sectional length of the line must equal the pitch of 0.6 microns. The length and the space can vary, but their sum will always equal 0.6 microns.

In dynamic random access memory (DRAM) fabrication, the limitations of photolithographic equipment also dictates how densely the storage cells of a memory array can be packed. Technological advances demand that the memory array become even more densely packed to provide DRAMs in the order of 256 Mbit and higher, in order to meet their memory hungry demands.

There is a real need to be able to push beyond the photolithographic limitations and build denser memory arrays, while still using the current equipment available. The present invention provides such a method, as will become apparent in the disclosure made hereinafter.

SUMMARY OF THE INVENTION

An embodiment of the present invention teaches a process for forming diffusion areas and field isolation regions on a silicon substrate, by the steps of:

growing a field oxide layer on the surface of the substrate;

forming a mask pattern which exposes a plurality of spaced-apart regions on the surface of the field oxide layer;

removing portions of the field oxide layer in the exposed, spaced-apart regions with an anisotropic etch so as to leave a cavity in each spaced-apart region, each cavity having as its floor an exposed region of the silicon substrate, and having vertical walls of field oxide;

angularly chamfering the rim of each cavity with a facet etch; and filling each cavity with silicon using selective epitaxial growth, and using the floor of each cavity as the seed crystal for such growth.

DETAILED DESCRIPTION OF THE INVENTION

Figure 5:
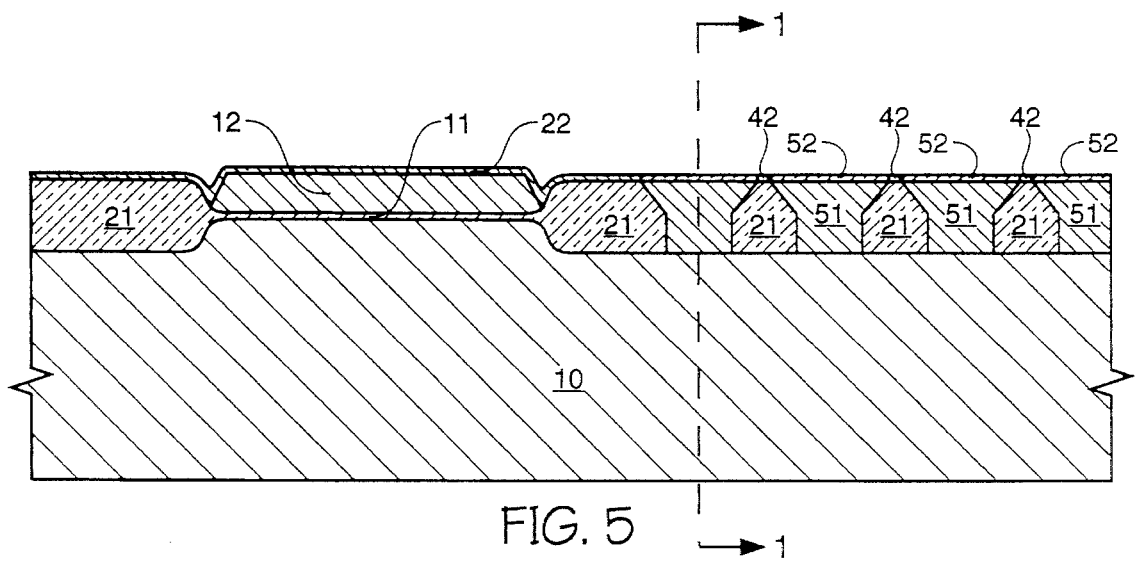
FIG. 5 is the in-process wafer portion of FIG. 4 following selective epitaxial silicon growth in the field oxide cavities and the formation of an overlying planarized oxide.
Figure 6:
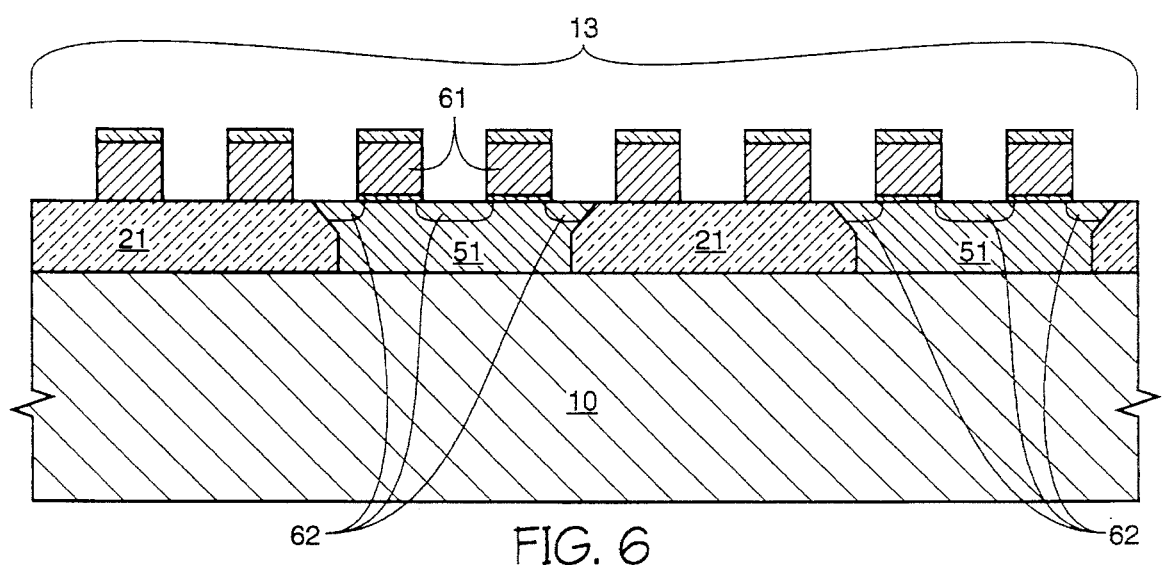
FIG. 6 is the in-process wafer portion of FIG. 5 (taken in a perpendicular cross-sectional view to that of FIG. 5) following the formation of patterned parallel wordlines.
Figure 7:
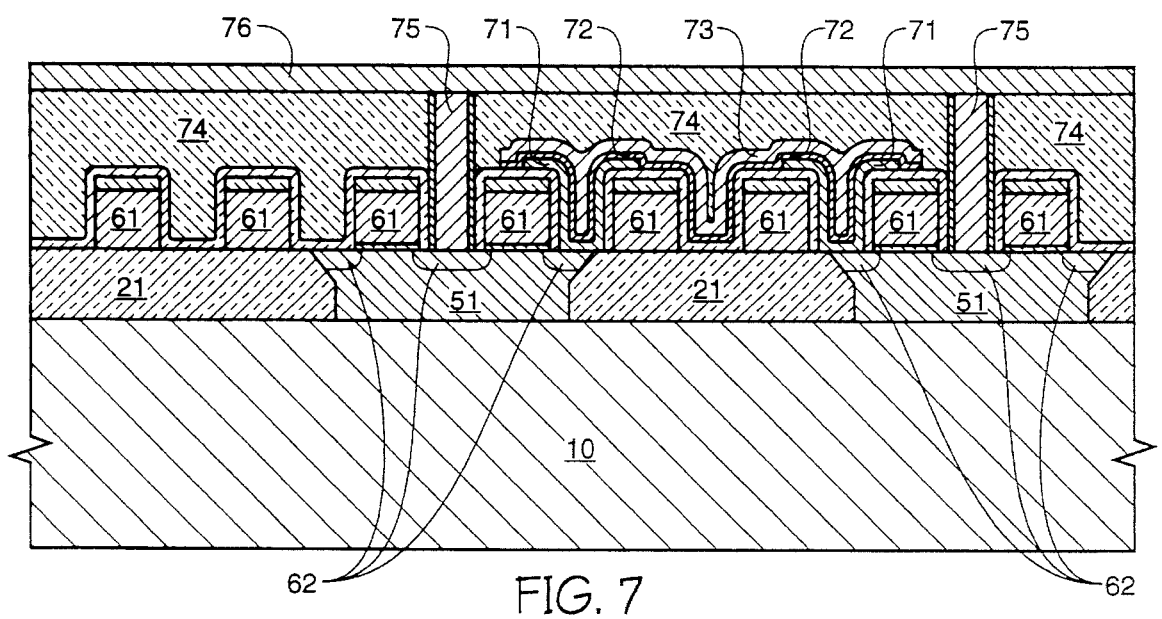
FIG. 7 is the in-process wafer portion of FIG. 6 following the formation of storage capacitors.

The present invention is depicted in a general embodiment in FIGS. 1–6 and in a specific embodiment as depicted in the subsequent steps shown in FIG. 7. Though FIGS. 1–6 depict a general concept of the present invention, the present invention is described in light of dynamic random access memory (DRAM) fabrication for illustrative purposes.

Figure 1:
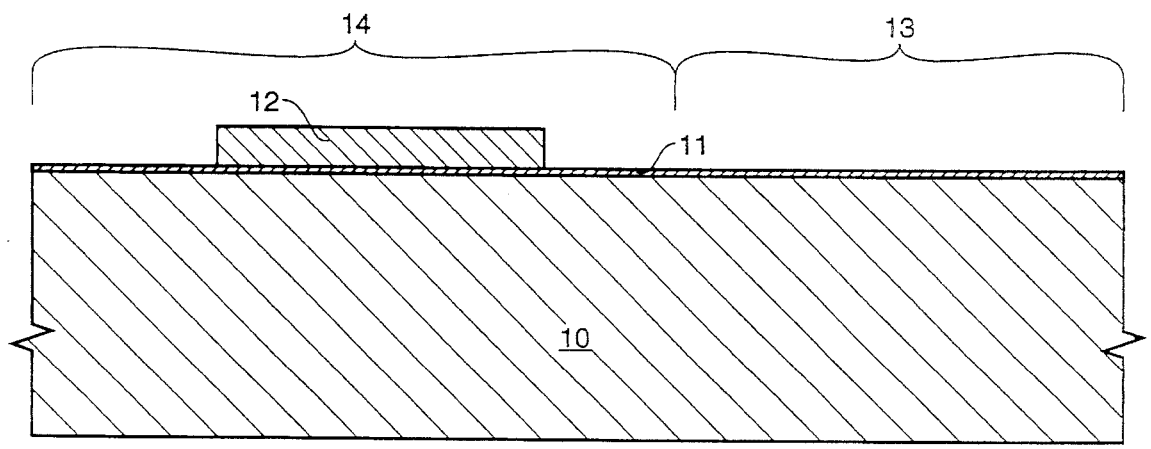
FIG. 1 is a composite cross-sectional view of an in-process wafer portion depicting a supporting substrate having a patterned nitride layer thereon.

Referring now to FIG. 1, a silicon substrate 10, has patterned silicon nitride layer 12 overlying silicon oxide layer 11. The nitride patterning in the periphery region 14 may be formed by standard LOCOS isolation. However, the present invention focuses on a new method of forming diffusion area isolation in the memory array region 13, while still using the standard LOCOS isolation in the periphery.

Figure 2:
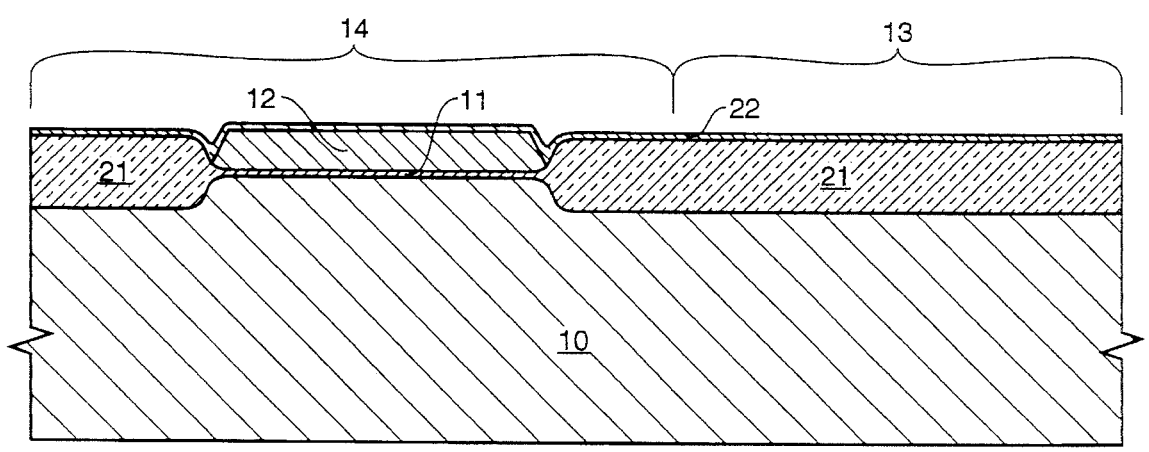
FIG. 2 is the in-process wafer portion of FIG. 1 after the growth of field oxide spaced apart by the patterned nitride and an overlying conformal layer of nitride.

Referring now to FIG. 2, silicon field oxide 21 is grown in all areas not covered by silicon nitride pattern 12. Once the silicon field oxide 21 is grown, a conformal layer 22 of nitride film is formed over oxide 21 and patterned nitride 12.

Figure 3:
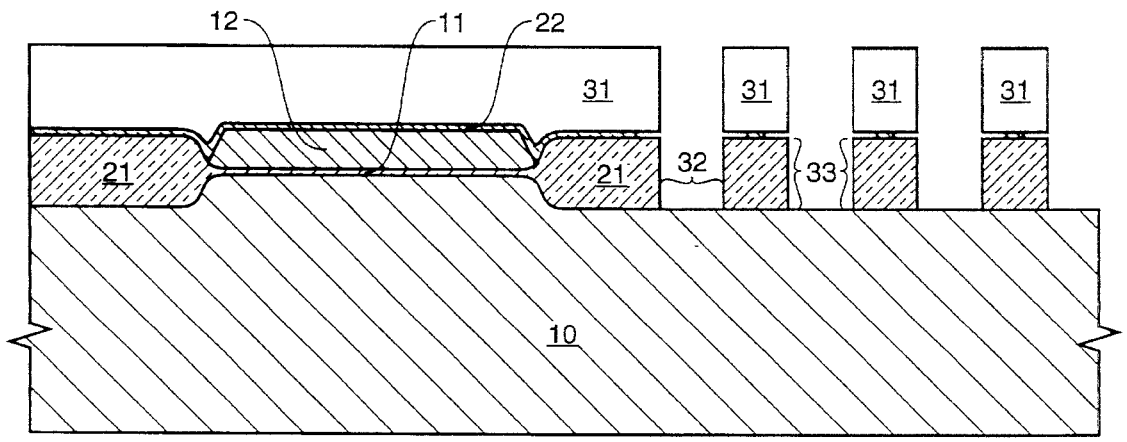
FIG. 3 is the in-process wafer portion of FIG. 2 after an isotropic etch is performed to form a plurality of cavities in the field oxide.

Referring now to FIG. 3, a photoresist pattern 31 is patterned into evenly spaced apart regions overlying the periphery region 13 of field oxide 21. An isotropic etch is then performed that removes the exposed nitride film 22 portions and thus creates cavities in underlying field oxide 21. This etch continues until the underlying substrate 10 is exposed via the cavities created at evenly spaced apart regions 32. During this etch, undercutting of nitride 22 occurs beneath the patterned edges of photoresist 31 and exposed field oxide sidewalls 33 are formed.

Figure 4:
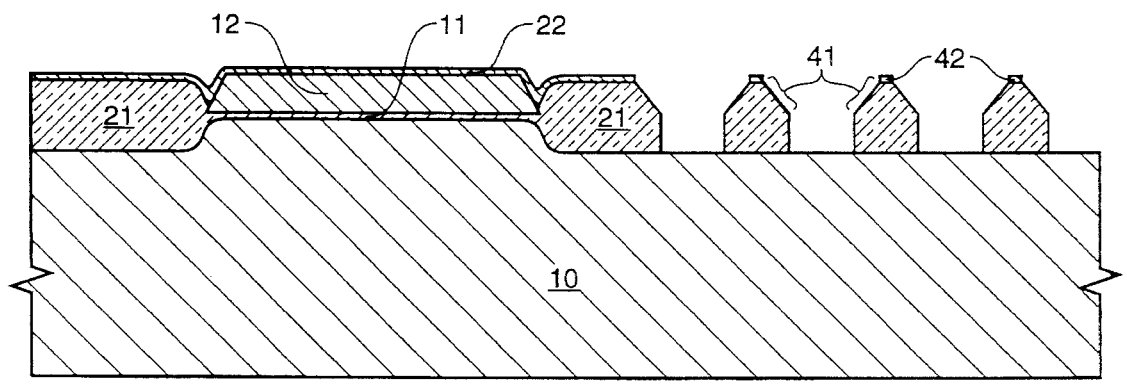
FIG. 4 is the in-process wafer portion of FIG. 3 following an angled facet etch on the upper edges of the field oxide.

Referring now to FIG. 4, an angled facet etch is performed that removes (or chamfers) an angled upper portion of each of the exposed field oxide sidewalls 33. This isotropic etch is performed as long as desired, but the emphasis here is to leave a portion of nitride masking film portion 42 residing on top of each field oxide isolation. In this example, portion 42 is approximately 0.1 microns in width, which will allow the width of subsequently grown silicon to be 0.5 microns for a 0.6 micron process. This allows one to maximize the space used for diffusion areas and of course, these widths will scale to even smaller dimensions as the equipment limitations decrease.

Though it is desirable to leave a portion of nitride masking film portion 42, an alternate method would be to remove only the exposed nitride 22 (see FIG. 3) then perform an isotropic etch that will both create the cavities in the field oxide while at the same time chamfer the rim of the cavities (which is the rim of the spaced-apart field oxide portions). Using this approach would then require complete stripping of the photoresist pattern 31 as well as the remaining nitride 22.

Referring now to FIG. 5, selective epitaxial grown (SEG) silicon 51 is grown to fill cavities at spaced apart regions 32, as well as growing adjacent to the angled sidewall portions of oxide 21. The silicon SEG 51 is grown to approximately the same height as the upper surface of oxide 21. Next, silicon SEG 51 is oxidized to form silicon oxide layer 52 that is approximately even with the top surface of nitride masking film 42.

Referring now to FIG. 6 (notice that FIG. 6 only shows the memory array region 13 and is a view that is perpendicular to FIG. 5), transistor gates 61 (or wordline transistor gates in this case), have been formed over silicon SEG 51 and oxide 22 such that there is a pair of transistor gates 61 evenly spaced over the silicon SEG 51 and a pair of gates 61 formed over oxide 22. The width of silicon SEG 51 (within the angled portion of oxide 22) allows for a subsequent conductive dopant implant to form diffusion regions 62. Due to the preceding process steps these diffusion regions can be reduced down to approximately 0.1 microns in width, which allows for tighter packing of transistors. Depending on the desired conductivity type the implant can use either N-type dopants (such as arsenic atoms) or P-type dopants (such as boron atoms).

FIG. 7 show an overall picture of how the present invention can be implemented in a DRAM process. Referring now to FIG. 7, the process continues until storage node capacitors are formed by the combination of bottom plates 71, capacitor dielectric 72 and top plate 73. A planarized insulation layer 74 separates the storage cell (a transistor and capacitor combination) from an overlying digitline 76. Digitline 76 is connected to a diffusion region 62 via a conductive plug 75.

The detailed description serves as an example of how the present invention can be implemented into DRAM applications. The technique used to form the sub-micron diffusion regions (approximately 0.1 microns) is the focus of the invention that will be beneficial to any semiconductor fabrication process in order to produce either smaller or denser integrated circuits or both.

Therefore, it is to be understood that although the present invention has been described with reference to several embodiments, various modifications, known to those skilled in the art, may be made to the structure and process steps presented herein without departing from the invention as recited in the several claims appended hereto.

What is claimed is:

1. A fabrication process for forming sub-micron diffusion area isolation in a semiconductor device, said process comprising the steps of:

forming a native oxide over a silicon substrate;

forming a first patterned mask over said native oxide exposing unmasked regions;

growing field oxide on said silicon substrate at the unmasked regions;

forming a nitride film over said field oxide and said first patterned mask;

forming a second patterned mask over said nitride film, thereby exposing spaced apart regions in said nitride film that overlies said field oxide;

removing said nitride film and said underlying field oxide at said exposed spaced apart regions and removing a portion of the nitride film residing beneath said second patterned mask, thereby providing exposed field oxide sidewalls;

removing an angled upper portion of each said exposed field oxide sidewall along with the corresponding overlying nitride film portion, thereby forming a nitride masking film having sub-micron width that overlies the remaining field oxide at said spaced apart regions;

growing silicon by selective epitaxial growth (SEG) in each spaced apart regions, said silicon SEG is grown to approximately the same height of the upper surface of said field oxide;

oxidizing the surface of said silicon SEG until the oxide level is approximately even with said nitride masking film, thereby forming a planarized surface;

forming a transistor gate over each silicon SEG grown region, said transistor gate being separated from said silicon SEG grown region by a gate oxide; and implanting a conductive dopant into the silicon SEG grown regions left uncovered by said transistor gate, to form diffusion regions therein; whereby an active transistor is formed therefrom.

2. The process of claim 1, wherein said first patterned mask comprises nitride.

3. The process of claim 1, wherein said second patterned mask comprises photoresist.

4. The process of claim 1, wherein said removing the nitride film and the underlying field oxide at said exposed spaced apart regions comprises an isotropic etch.

5. The process of claim 1, wherein said removing an angled upper portion of each said exposed field oxide sidewall along with the corresponding overlying nitride film portion comprises an isotropic etch.

6. The process of claim 1, wherein the dopants used for said implanting comprise N-type dopants.

7. The process of claim 1, wherein the dopants used for said implanting comprise P-type dopants.

8. The process of claim 6, wherein said N-type dopants comprise arsenic atoms.

9. The process of claim 7, wherein said P-type dopants comprise boron atoms.

10. A fabrication process for forming sub-micron diffusion area isolation in a Dynamic Random Access Memory (DRAM) device, said process comprising the steps of:

forming a native oxide over a silicon substrate;

forming a patterned nitride mask over said native oxide exposing unmasked regions;

growing field oxide on said silicon substrate at the unmasked regions;

forming a nitride film over said field oxide and said patterned nitride mask;

forming a patterned photoresist mask over said nitride film, thereby exposing spaced apart regions in the nitride film that overlies the field oxide;

isotropically etching the nitride film and the underlying field oxide at said exposed spaced apart regions, thereby providing exposed field oxide sidewalls and removing a portion of said nitride film that resides beneath the patterned edges of said patterned photoresist mask;

performing an isotropic etch on the upper portion of each said exposed field oxide sidewall along with the corresponding overlying nitride film portion, thereby forming a nitride masking film having a sub-micron width that overlies the remaining field oxide at said spaced apart regions;

growing silicon SEG in each spaced apart regions, said silicon SEG is grown to approximately the same height as the upper surface of said field oxide;

oxidizing the surface of said silicon SEG until the oxide level is approximately even with the surface of said nitride masking film, thereby forming a planarized surface;

forming a pair of wordlines over each silicon SEG grown region and a pair of wordlines over each spaced apart areas of field oxide, said pair of wordlines are separated from said silicon SEG grown region by a gate oxide; and implanting a conductive dopant into the silicon SEG grown regions left uncovered by said wordlines, thereby forming diffusion regions therein; whereby an access transistor is formed therefrom.

11. The process of claim 10, wherein the dopants used for said implanting comprise N-type dopants.

12. The process of claim 10, wherein the dopants used for said implanting comprise P-type dopants.

13. The process of claim 11, wherein said N-type dopants comprise arsenic atoms.

14. The process of claim 12, wherein said P-type dopants comprise boron atoms.

15. A fabrication process for a forming storage cell having sub 0.1 micron diffusion area isolation in a Dynamic Random Access Memory (DRAM), said process comprising the steps of:

forming a native oxide over a silicon substrate;

forming a patterned nitride mask over said native oxide exposing unmasked regions;

growing field oxide on said silicon substrate at the unmasked regions;

forming a nitride film over said field oxide and said patterned nitride mask;

forming a patterned photoresist mask over said nitride film, thereby exposing spaced apart regions in the nitride film that overlies the field oxide;

isotropically etching the nitride film and the underlying field oxide at said exposed spaced apart regions, thereby providing exposed field oxide sidewalls and removing a portion of said nitride film that resides beneath the patterned edges of said patterned photoresist mask;

performing an isotropic etch on the upper portion of each said exposed field oxide sidewall along with the corresponding overlying nitride film portion, thereby forming a nitride masking film having a sub-micron width that overlies the remaining field oxide at said spaced apart regions;

growing silicon SEG in each spaced apart regions, said silicon SEG is grown to approximately the same height as the upper surface of said field oxide;

oxidizing the surface of said silicon SEG until the oxide level is approximately even with the surface of said nitride masking film, thereby forming a planarized surface;

forming a pair of wordlines over each silicon SEG grown region and a pair of wordlines over each spaced apart areas of field oxide, said pair of wordlines are separated from said silicon SEG grown region by a gate oxide;

implanting a conductive dopant into the silicon SEG grown regions left uncovered by said wordlines, thereby forming diffusion regions therein; wherein an access transistor is formed therefrom;

forming a storage capacitor that connects to a diffusion region on one side of the access transistors; and connecting a digitline to the diffusion area on the other side of the access transistor.

16. The process of claim 15, wherein the dopants used for said implanting comprise N-type dopants.

17. The process of claim 15, wherein the dopants used for said implanting comprise P-type dopants.

18. The process of claim 16, wherein said N-type dopants comprise arsenic atoms.

19. The process of claim 17, wherein said P-type dopants comprise boron atoms.

20. A process for forming diffusion areas and field isolation regions on a silicon substrate, said process comprising the following steps:

a) growing a field oxide layer on the surface of said substrate;

b) forming a mask pattern which exposes a plurality of spaced-apart regions on the surface of said field oxide layer;

c) removing portions of the field oxide layer in the exposed, spaced-apart regions with an isotropic etch so as to leave a cavity in each spaced-apart region, each cavity having as its floor an exposed region of said silicon substrate, and having vertical walls of field oxide;

d) angularly chamfering the rim of each cavity with an isotropic etch; and e) filling each cavity with silicon using selective epitaxial growth, and using the floor of each cavity as the seed crystal for such growth.

21. The process of claim 20, wherein said step "c" and "d" are performed as an isotropic etch that will create cavities in the field oxide while at the same time chamfer the rim of said cavities.

22. The process of claim 20, wherein the filling of each cavity is allowed to proceed until the epitaxially-grown silicon has achieved a level greater than the upper surface of the field oxide layer.

23. The process of claim 22, wherein the exposed upper surface of the epitaxially-grown silicon is oxidized to an extent necessary to make the surface of the unoxidized epitaxially grown silicon equiplanar with the upper surface of the field oxide layer.

\* \* \* \* \*